United States Patent
Nayuki

(10) Patent No.: US 10,076,805 B2
(45) Date of Patent: Sep. 18, 2018

(54) LASER PROCESSING APPARATUS

(71) Applicant: DISCO CORPORATION, Tokyo (JP)

(72) Inventor: Masatoshi Nayuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 364 days.

(21) Appl. No.: 15/140,053

(22) Filed: Apr. 27, 2016

(65) Prior Publication Data

US 2016/0311058 A1    Oct. 27, 2016

(30) Foreign Application Priority Data

Apr. 27, 2015  (JP) ................. 2015-090120

(51) Int. Cl.
| | | |
|---|---|---|
| *B23K 26/0622* | (2014.01) | |
| *B23K 26/06* | (2014.01) | |
| *H01L 21/68* | (2006.01) | |
| *H01L 21/78* | (2006.01) | |
| *H01L 21/687* | (2006.01) | |
| *B23K 103/00* | (2006.01) | |

(52) U.S. Cl.
CPC ...... *B23K 26/0622* (2015.10); *B23K 26/0643* (2013.01); *H01L 21/68* (2013.01); *B23K 2203/50* (2015.10); *H01L 21/68728* (2013.01); *H01L 21/78* (2013.01)

(58) Field of Classification Search
CPC .. B23K 26/0622; B23K 26/0643; H01L 21/68
See application file for complete search history.

(56) References Cited

U.S. PATENT DOCUMENTS 4,441,126 A * 4/1984 Greenig ............ G06K 15/1219
                                                          358/481

FOREIGN PATENT DOCUMENTS

JP    2005-064231    3/2005

* cited by examiner

*Primary Examiner* — Joseph S Del Sole
*Assistant Examiner* — John Robitaille
(74) *Attorney, Agent, or Firm* — Greer Burns & Crain, Ltd.

(57) ABSTRACT

A laser beam irradiating mechanism of a laser processing apparatus includes: a pulsed laser oscillator configured to oscillate a pulsed laser beam; a condenser configured to condense the laser beam oscillated from the pulsed laser oscillator, and irradiate a workpiece held on a chuck table with the condensed laser beam; a polygon mirror disposed between the pulsed laser oscillator and the condenser, and having a plurality of mirrors arranged concentrically with respect to a rotating shaft, the plurality of mirrors dispersing the pulsed laser beam oscillated from the pulsed laser oscillator; and a guiding unit disposed between the pulsed laser oscillator and the polygon mirror, the guiding unit guiding the pulsed laser beam such that the pulsed laser beam is not applied to an angular portion of mirrors adjacent to each other.

2 Claims, 3 Drawing Sheets

LASER PROCESSING APPARATUS

BACKGROUND OF THE INVENTION

1. Field of the Invention

The present invention relates to a laser processing apparatus that performs laser processing on a workpiece such as a semiconductor wafer or the like held on a chuck table.

2. Description of the Related Art

In a semiconductor device manufacturing process, a plurality of regions are partitioned by division lines arranged in a lattice manner on the front surface of a semiconductor wafer in substantially the shape of a disk, and devices such as ICs, LSIs, or the like are formed in the partitioned regions. The regions in which the devices are formed are then divided from each other by cutting the semiconductor wafer along the division lines. The individual semiconductor devices are thus manufactured.

Recently, in order to improve the throughput of a semiconductor chip such as an IC, an LSI, or the like, a semiconductor wafer has been put to practical use in which semiconductor devices are formed by a functional layer including a low dielectric constant insulator film (low-k film) laminated on the front surface of a substrate such as silicon or the like, the low dielectric constant insulator film being formed by a film of an inorganic material such as SiOF, BSG (SiOB), or the like, or a film of an organic material which film is a polyimide-based polymer film, a parylene-based polymer film, or the like.

Division along the division lines of such a semiconductor wafer is generally performed by a cutting device referred to as a dicing saw. This cutting device includes a chuck table holding the semiconductor wafer as a workpiece, cutting means for cutting the semiconductor wafer held on the chuck table, and moving means for moving the chuck table and the cutting means relative to each other. The cutting means includes a rotary spindle rotated at a high speed and a cutting blade mounted on the spindle. The cutting blade includes a disk-shaped base and an annular cutting edge mounted on the side surface of an outer circumferential portion of the base. The cutting edge is for example formed by fixing diamond abrasive grains having a grain size of approximately 3 μm by electroforming.

However, the above-described low-k film is difficult to cut by the cutting blade. That is, the low-k film is very fragile like mica. Therefore, when the semiconductor wafer is cut along the division lines by the cutting blade, the low-k film peels off, and this peeling reaches circuits and causes a fatal damage to the devices.

In order to solve this problem, Japanese Patent Laid-Open No. 2005-64231 discloses a wafer dividing method including irradiating both sides in a width direction of a division line formed on a semiconductor wafer with a laser beam along the division line, thereby forming two laser-processed grooves and dividing a laminate including a low-k film along the division line, and positioning a cutting blade between the outsides of the two laser processed grooves and moving the cutting blade and the semiconductor wafer relative to each other, thereby cutting the semiconductor wafer along the division line.

SUMMARY OF THE INVENTION

However, when ablation processing is performed by applying the laser beam along the division line, and thereby the laminate including the low-k film is removed and the laser-processed grooves are formed, the laser-processed grooves are refilled with a melt scattered from the laminate. Therefore, in order to form laser-processed grooves having a sufficient width, the laser beam needs to be applied along the division line a plurality of times. There is thus a problem of poor productivity.

In addition, also in a technology that forms dividing grooves by performing ablation processing by applying a laser beam having a wavelength absorbable by a wafer along division lines, and divides the wafer into individual devices, the dividing grooves are refilled with a melt. Therefore, in order to form dividing grooves necessary for division, the laser beam needs to be applied along the division lines a plurality of times. There is thus a problem of poor productivity.

In accordance with an aspect of the present invention, there is provided a laser processing apparatus including a chuck table configured to hold a workpiece, and a laser beam irradiating mechanism configured to perform laser processing on the workpiece held by the chuck table. The laser beam irradiating mechanism includes a pulsed laser oscillator configured to oscillate a pulsed laser beam, a condenser configured to condense the laser beam oscillated from the pulsed laser oscillator, and irradiate the workpiece held on the chuck table with the condensed laser beam, a polygon mirror disposed between the pulsed laser oscillator and the condenser, and having a plurality of mirrors arranged concentrically with respect to a rotating shaft, the plurality of mirrors dispersing the pulsed laser beam oscillated from the pulsed laser oscillator, and guiding means disposed between the pulsed laser oscillator and the polygon mirror, the guiding means guiding the pulsed laser beam such that the pulsed laser beam is not applied to an angular portion of mirrors adjacent to each other.

The guiding means includes an optical switching element configured to selectively guide the pulsed laser beam oscillated from the pulsed laser oscillator to a first path and a second path, a polarization beam splitter configured to guide the pulsed laser beams guided to the first path and the second path to a third path in which the polygon mirror is disposed, rotation position detecting means for detecting a rotation position of the polygon mirror, and control means for controlling the optical switching element on a basis of a detection signal from the rotation position detecting means such that the pulsed laser beams are not applied to an angular portion of a mirror and a mirror of the polygon mirror. The first path and the second path are positioned such that the polarization beam splitter branches the pulsed laser beam guided to the first path and the pulsed laser beam guided to the second path with a predetermined interval between the pulsed laser beam guided to the first path and the pulsed laser beam guided to the second path.

According to the laser processing apparatus in accordance with the present invention, the pulsed laser beam does not fall on an angular portion of a mirror and a mirror of the rotating polygon mirror. Thus, the pulsed laser beam is prevented from scattering, which is caused by the falling of the pulsed laser beam on an angular portion of a mirror and a mirror of the polygon mirror. It is therefore possible to solve the problems of the occurrence of a processing loss when the pulsed laser beam falls on an angular portion of a mirror and a mirror of the polygon mirror, and is thus scattered and unable to be applied to a predetermined processing region, and a degradation in quality of the workpiece due to the scattering of the pulsed laser beam.

In addition, the laser beam irradiating mechanism of the laser processing apparatus according to the present invention repeatedly irradiates the workpiece held on the chuck table with a plurality of pulses of the pulsed laser beam. Thus, because ablation processing is performed in an overlapping manner, refilling with a melt can be prevented. By performing processing feed of the chuck table, it is possible to form a laser-processed groove having a desired width in a low-k film, a substrate, or the like as the workpiece efficiently.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
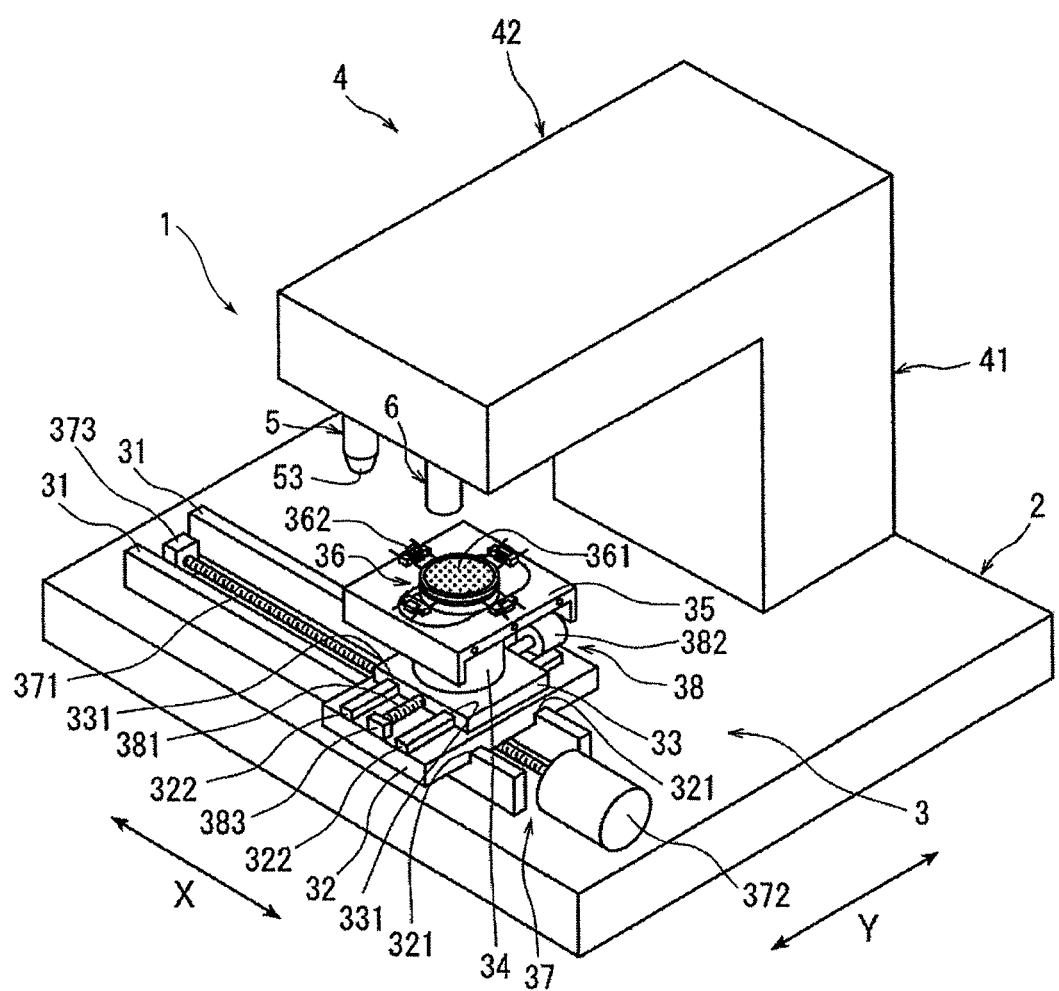
FIG. 1 is a perspective view of a laser processing apparatus configured according to the present invention.

A preferred embodiment of a laser processing apparatus configured according to the present invention will hereinafter be described in detail with reference to the accompanying drawings. FIG. 1 is a perspective view of the laser processing apparatus 1 according to an embodiment of the present invention. The laser processing apparatus 1 shown in FIG. 1 includes: a stationary base 2; a chuck table mechanism 3 disposed on the stationary base 2 so as to be movable in a processing feed direction (X-axis direction) indicated by an arrow X, the chuck table mechanism 3 holding a workpiece; and a laser beam irradiating unit 4 as laser beam irradiating means disposed on the stationary base 2.

The chuck table mechanism 3 includes: a pair of guide rails 31 arranged on the stationary base 2 so as to be parallel with each other along the X-axis direction; a first sliding block 32 disposed on the guide rails 31 so as to be movable in the X-axis direction; a second sliding block 33 disposed on the first sliding block 32 so as to be movable in a Y-axis direction indicated by an arrow Y, the Y-axis direction being orthogonal to the X-axis direction; a cover table 35 supported on the second sliding block 33 by a cylindrical member 34; and a chuck table 36 as a chuck table. The chuck table 36 has a suction chuck 361 formed of a porous material. Suction means not shown in the figure holds for example a circular semiconductor wafer as a workpiece on a holding surface as a top surface of the suction chuck 361. The chuck table 36 formed in this manner is rotated by a pulse motor not shown in the figure which pulse motor is disposed within the cylindrical member 34. Incidentally, the chuck table 36 is provided with a clamp 362 for fixing an annular frame that supports a workpiece such as a semiconductor wafer or the like via a protective tape.

The first sliding block 32 is provided with a pair of guided grooves 321 in an undersurface thereof, the pair of guided grooves 321 being fitted to the pair of guide rails 31, and is provided with a pair of guide rails 322 on a top surface thereof, the pair of guide rails 322 being formed in parallel with each other along the Y-axis direction. The first sliding block 32 formed in this manner is formed so as to be movable in the X-axis direction along the pair of guide rails 31 by fitting the guided grooves 321 to the pair of guide rails 31. The chuck table mechanism 3 in the present embodiment has X-axis direction moving means 37 for moving the first sliding block 32 in the X-axis direction along the pair of guide rails 31. The X-axis direction moving means 37 includes a male screw rod 371 disposed between and in parallel with the pair of guide rails 31 and a driving source such as a pulse motor 372 or the like for rotation-driving the male screw rod 371. One end of the male screw rod 371 is rotatably supported by a bearing block 373 fixed to the stationary base 2. Another end of the male screw rod 371 is transmissively coupled to the output shaft of the pulse motor 372. It is to be noted that the male screw rod 371 is screwed into a through female screw hole formed in a female screw block not shown in the figures which female screw block is provided in a projecting manner on the undersurface of a central portion of the first sliding block 32. Hence, the first sliding block 32 is moved in the X-axis direction along the guide rails 31 by driving the male screw rod 371 for normal rotation and reverse rotation by the pulse motor 372.

The second sliding block 33 is provided with a pair of guided grooves 331 in an undersurface thereof, the pair of guided grooves 331 being fitted to the pair of guide rails 322 provided on the top surface of the first sliding block 32. The second sliding block 33 is formed so as to be movable in the Y-axis direction by fitting the guided grooves 331 to the pair of guide rails 322. The chuck table mechanism 3 in the present embodiment includes Y-axis direction moving means 38 for moving the second sliding block 33 in the Y-axis direction along the pair of guide rails 322 provided on the first sliding block 32. The Y-axis direction moving means 38 includes a male screw rod 381 disposed between and in parallel with the pair of guide rails 322 and a driving source such as a pulse motor 382 or the like for rotation-driving the male screw rod 381. One end of the male screw rod 381 is rotatably supported by a bearing block 383 fixed to the top surface of the first sliding block 32. Another end of the male screw rod 381 is transmissively coupled to the output shaft of the pulse motor 382. It is to be noted that the male screw rod 381 is screwed into a through female screw hole formed in a female screw block not shown in the figures which female screw block is provided in a projecting manner on the undersurface of a central portion of the second sliding block 33. Hence, the second sliding block 33 is moved in the Y-axis direction along the guide rails 322 by driving the male screw rod 381 for normal rotation and reverse rotation by the pulse motor 382.

The laser beam irradiating unit 4 includes: a supporting member 41 disposed on the stationary base 2; a casing 42 supported by the supporting member 41, and extending substantially horizontally; a laser beam irradiating mechanism 5 disposed on the casing 42; and imaging means 6 for detecting a processing region to be laser-processed, the imaging means 6 being disposed on a front end portion of the casing 42. Incidentally, the imaging means 6 includes for example: illuminating means for illuminating the workpiece; an optical system that captures a region illuminated by the illuminating means; and an imaging element (CCD) that images an image captured by the optical system.

The laser beam irradiating mechanism 5 will be described with reference to FIG. 2 and FIG. 3. The laser beam irradiating mechanism 5 includes: a pulsed laser oscillator 51; power adjusting means 52 for adjusting the power of a pulsed laser beam oscillated from the pulsed laser oscillator 51; a condenser 53 that condenses the pulsed laser beam whose power is adjusted by the power adjusting means 52, and irradiates the workpiece held on the chuck table 36 with the condensed pulsed laser beam; a polygon mirror 54 disposed between the power adjusting means 52 and the condenser 53, and having a plurality of mirrors disposed concentrically with respect to a rotating shaft, the plurality of mirrors dispersing the pulsed laser beam oscillated from the pulsed laser oscillator 51 and adjusted in power by the power adjusting means 52; and guiding means 55 disposed between the pulsed laser oscillator 51 and the polygon mirror 54 to guide the pulsed laser beam such that the pulsed laser beam is not applied to an angular portion of mirrors adjacent to each other.

The pulsed laser oscillator 51 in the present embodiment oscillates a pulsed laser beam LB having a wavelength of 355 nm. The condenser 53 includes an fθ lens 531 that condenses the pulsed laser beam oscillated from the pulsed laser oscillator 51 and adjusted in power by the power adjusting means 52. Incidentally, the pulsed laser oscillator 51 and the power adjusting means 52 are controlled by control means 7.

The polygon mirror 54 has a plurality of mirrors 541 arranged concentrically with respect to a rotating shaft 542. The polygon mirror 54 is rotated by a scanning motor 543 in a direction indicated by an arrow (A) in FIG. 2. Incidentally, in the present embodiment, the mirrors 541 of the polygon mirror 54 are fitted to the outer peripheral surface of a regular octagon. The scanning motor 543 of the thus formed polygon mirror 54 is controlled by the control means 7.

The above-described guiding means 55 includes: an optical switching element 552 that selectively guides the pulsed laser beam LB oscillated from the pulsed laser oscillator 51 to a first path 551a and a second path 551b; and a polarization beam splitter 553 that guides the pulsed laser beam guided to the first path 551a and the second path 551b to a third path 551c in which the polygon mirror 54 is disposed. The optical switching element 552 is formed by an acoustooptic device (AOD), an EOD, or the like. The optical switching element 552 in a state in which no voltage signal is applied to the optical switching element 552 guides the pulsed laser beam LB oscillated from the pulsed laser oscillator 51 to the first path 551a. When a predetermined voltage signal is applied to the optical switching element 552, the optical switching element 552 guides the pulsed laser beam LB oscillated from the pulsed laser oscillator 51 to the second path 551b. The optical switching element 552 is controlled by the control means 7.

Arranged in the first path 551a are: a direction changing mirror 554a that changes the direction of the first pulsed laser beam LB1 guided to the first path 551a by the optical switching element 552 toward the polarization beam splitter 553; and a half-wave plate 555a that rotates the plane of polarization of the first pulsed laser beam LB1, whose direction is changed by the direction changing mirror 554a, to provide P-polarized light with respect to the polarization beam splitter 553. In addition, arranged in the second path 551b are: a direction changing mirror 554b that changes the direction of the second pulsed laser beam LB2 guided to the second path 551b by the optical switching element 552; a half-wave plate 555b that rotates the plane of polarization of the second pulsed laser beam LB2, whose direction is changed by the direction changing mirror 554b, to provide S-polarized light with respect to the polarization beam splitter 553; and a direction changing mirror 556b that guides the second pulsed laser beam LB2 polarized into the S-polarized light by the half-wave plate 555b to the polarization beam splitter 553.

The polarization beam splitter 553 passes the first pulsed laser beam LB1 polarized into the P-polarized light and guides the first pulsed laser beam LB1 to the third path 551c, and reflects the second pulsed laser beam LB2 polarized into the S-polarized light and guides the second pulsed laser beam LB2 to the third path 551c. It is to be noted that, in the present embodiment, the second pulsed laser beam LB2 polarized into the S-polarized light is made to enter the polarization beam splitter 553 at a predetermined interval (L) from the optical path of the first pulsed laser beam LB1 polarized into the P-polarized light. Hence, the polarization beam splitter 553 branches the first pulsed laser beam LB1 and the second pulsed laser beam LB2 into the third path 551c with the predetermined interval (L) between the first pulsed laser beam LB1 and the second pulsed laser beam LB2. The first pulsed laser beam LB1 and the second pulsed laser beam LB2 branched into the third path 551c are respectively guided to a first position 54a and a second position 54b of the polygon mirror 54 via a direction changing mirror 557.

Figure 2:
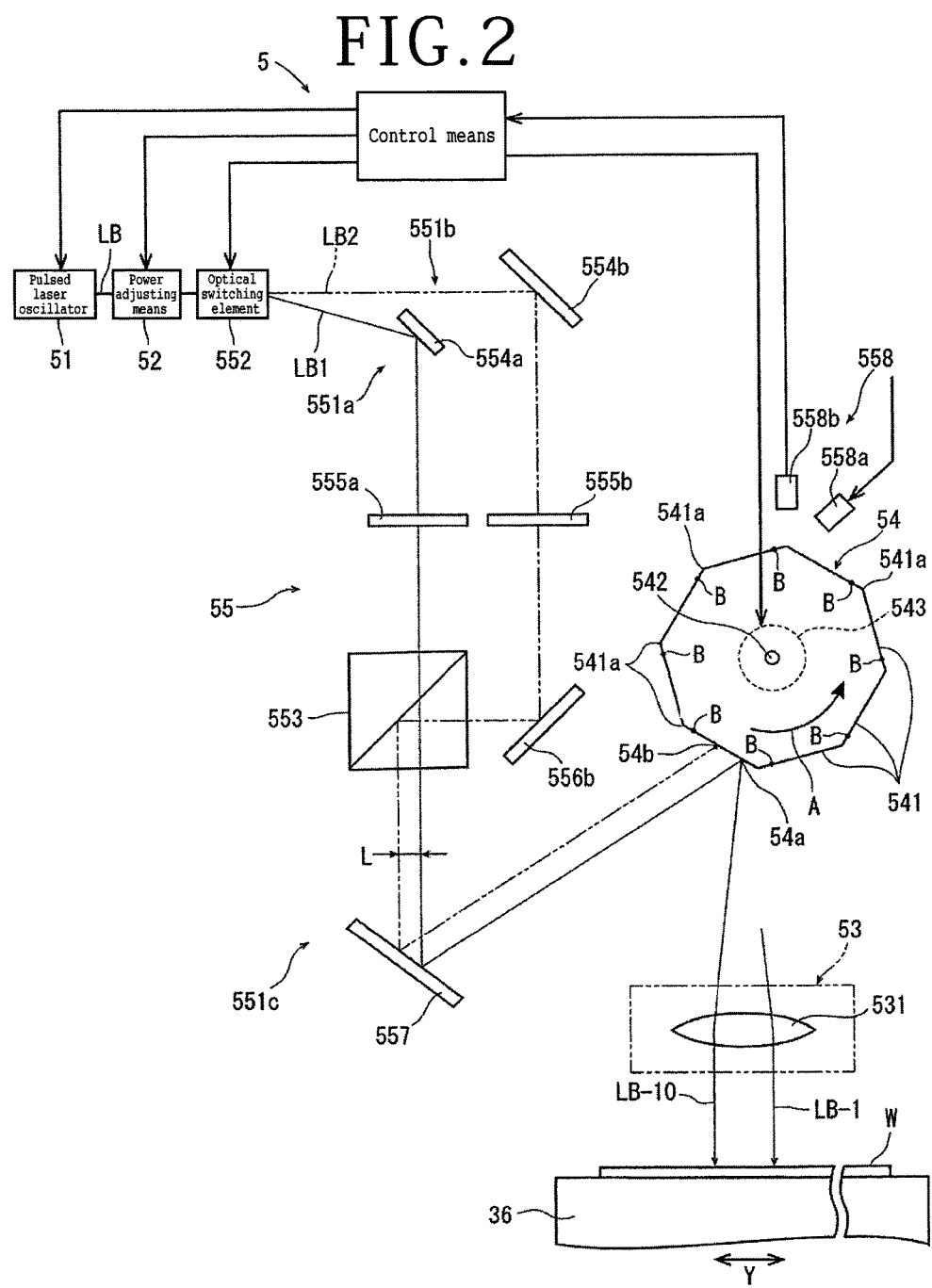
FIG. 2 is a block diagram of a laser beam irradiating mechanism provided in the laser processing apparatus shown in FIG. 1.
Figure 3:
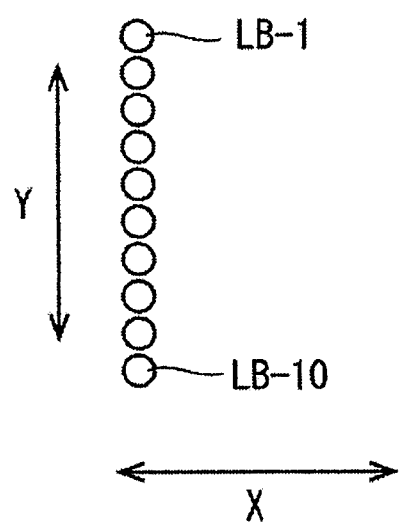
FIG. 3 is a diagram of assistance in explaining a state of pulses of a pulsed laser beam with which pulses a workpiece is irradiated, the pulsed laser beam being oscillated from a pulsed laser oscillator of the laser beam irradiating mechanism shown in FIG. 2.

Continuing the description with reference to FIG. 2, the guiding means 55 has rotation position detecting means 558 for detecting the rotation position of the polygon mirror 54. The rotation position detecting means 558 in the present embodiment includes a light emitting element 558a and a light receiving element 558b that receives light emitted by the light emitting element 558a and reflected by a mirror (reflecting surface) 541 of the polygon mirror 54. Incidentally, the light receiving element 558b is positioned so as to receive light reflected at a position (B) slightly more frontward in the rotating direction indicated by the arrow (A) than an angular portion 541a of a mirror 541 and a mirror 541 of the polygon mirror 54. The light receiving element 558b sends a light reception signal to the control means 7.

The laser processing apparatus in the present embodiment is configured as described above. A form of irradiation with the pulsed laser beam by the laser beam irradiating mechanism 5 will be described in the following. For example, supposing that the rotational speed of the polygon mirror 54 is 500 revolutions per second, because the polygon mirror 54 has the mirrors 541 on eight surfaces, a moving time per mirror 541 is 1/4000 of a second. Meanwhile, supposing that the repetition frequency of the pulsed laser beam LB oscillated from the pulsed laser oscillator 51 is 40 kHz, one mirror 541 of the polygon mirror 54 is irradiated with ten pulses of the pulsed laser beam.

As shown in FIG. 2, the pulsed laser beam LB oscillated from the pulsed laser oscillator 51 and adjusted in power by the power adjusting means 52 is guided to the optical switching element 552 forming the guiding means 55. When no voltage signal is applied to the optical switching element 552, the pulsed laser beam LB oscillated from the pulsed laser oscillator 51 is guided to the first path 551a. The first pulsed laser beam LB1 guided to the first path 551a passes through the half-wave plate 555a via the direction changing mirror 554a. The first pulsed laser beam LB1 is thereby polarized into P-polarized light with respect to the polarization beam splitter 553. Hence, the first pulsed laser beam LB1 polarized into the P-polarized light passes through the polarization beam splitter 553, and is then guided to the third path 551c. The first pulsed laser beam LB1 guided to the third path 551c is guided to the first position 54a of the polygon mirror 54 via the direction changing mirror 557.

The polygon mirror 54 is rotating at a predetermined rotational speed (500 revolutions per second in the present embodiment) in the direction indicated by the arrow (A). The polygon mirror 54 therefore guides the ten pulses (LB-1 to LB-10) of the pulsed laser beam to the fθ lens 531 along the Y-axis direction. The ten pulses (LB-1 to LB-10) of the pulsed laser beam which pulses are thus guided to the fθ lens 531 are each condensed by the fθ lens 531 to irradiate the workpiece W held on the chuck table 36 along the Y-axis direction, as shown in FIG. 3. Hence, by performing the irradiation with the ten pulses (LB-1 to LB-10) in a range of 50 μm, for example, in the Y-axis direction, laser processing can be performed with a width of 50 μm.

As described above, the pulsed laser beam may fall on an angular portion 541a of a mirror 541 and a mirror 541 of the polygon mirror 54 while laser processing is performed by the first pulsed laser beam LB1 guided to the first path 551a by the optical switching element 552. In this case, the pulsed laser beam is scattered and cannot be applied to a predetermined processing region, thus causing a processing loss, and the scattering of the pulsed laser beam degrades the quality of the workpiece.

The present embodiment has the rotation position detecting means 558 that detects a position slightly more frontward in the rotating direction indicated by the arrow (A) than an angular portion 541a of a mirror 541 and a mirror 541 of the polygon mirror 54. When the position (B) slightly more frontward in the rotating direction than the angular portion 541a of the mirror 541 and the mirror 541 reaches the first position 54a of the polygon mirror 54 which position is the incidence position of the first pulsed laser beam LB1, the light receiving element 558b receives light emitted by the light emitting element 558a and reflected by a mirror 541, and sends a light reception signal to the control means 7. The control means 7, to which the light reception signal is input from the light receiving element 558b, applies a voltage signal to the optical switching element 552. As a result, the pulsed laser beam LB oscillated from the pulsed laser oscillator 51 is guided to the second path 551b.

The second pulsed laser beam LB2 guided to the second path 551b passes through the half-wave plate 555b via the direction changing mirror 554b. The second pulsed laser beam LB2 is thereby polarized into S-polarized light with respect to the polarization beam splitter 553. Hence, the second pulsed laser beam LB2 polarized into the S-polarized light is branched by the polarization beam splitter 553 via the direction changing mirror 556b as described above, and is then guided to the third path 551c. The second pulsed laser beam LB2 guided to the third path 551c is guided to the second position 54b of the polygon mirror 54 via the direction changing mirror 557. The second pulsed laser beam LB2 thus guided to the second position 54b of the polygon mirror 54 is guided to the next mirror 541 over the angular portion 541a of the mirror 541 and the mirror 541 of the rotating polygon mirror 54. Hence, the pulsed laser beam does not fall on the angular portion 541a of the mirror 541 and the mirror 541 of the polygon mirror 54.

After one pulse of the second pulsed laser beam LB2 is guided to the second position 54b of the polygon mirror 54 as described above, the control means 7 stops applying the voltage signal to the optical switching element 552. As a result, as described above, the pulsed laser beam LB oscillated from the pulsed laser oscillator 51 is guided to the first path 551a, and the first pulsed laser beam LB1 guided to the first path 551a is guided to the first position 54a of the polygon mirror 54. At this time, because the polygon mirror 54 is rotating at a rotational speed of 500 revolutions per second, for example, in the direction indicated by the arrow (A), the first pulsed laser beam LB1 is guided to the same mirror as the mirror 541 to which the one pulse of the second pulsed laser beam LB2 is guided. The control means 7 thus alternately stops applying and applies the voltage signal to the optical switching element 552 on the basis of the light reception signal from the light receiving element 558b of the rotation position detecting means 558. The ten pulses (LB-1 to LB-10) can be thereby guided to each mirror 541 without the pulsed laser beam falling on an angular portion 541a of a mirror 541 and a mirror 541 of the polygon mirror 54 which mirrors are adjacent to each other.

As described above, in the laser beam irradiating mechanism 5 in the present embodiment, the pulsed laser beam does not fall on an angular portion 541a of a mirror 541 and a mirror 541 of the rotating polygon mirror 54 which mirrors are adjacent to each other. Thus, the pulsed laser beam is prevented from scattering, which is caused by the falling of the pulsed laser beam on an angular portion 541a of a mirror 541 and a mirror 541 of the polygon mirror 54. It is therefore possible to solve the problems of the occurrence of a processing loss when the pulsed laser beam falls on an angular portion 541a of a mirror 541 and a mirror 541 of the polygon mirror 54, and is thus scattered and unable to be applied to a predetermined processing region, and a degradation in quality of the workpiece due to the scattering of the pulsed laser beam.

In addition, in the laser beam irradiating mechanism 5 in the present embodiment, the workpiece W held on the chuck table 36 is repeatedly irradiated with the ten pulses (LB-1 to LB-10) of the pulsed laser beam. Ablation processing is thus performed in an overlapping manner in the Y-axis direction by performing processing feed of the chuck table 36 in the X-axis direction. It is therefore possible to prevent refilling with a melt, and thus form a laser-processed groove having a desired width in a low-k film, a substrate, or the like as the workpiece efficiently.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
    a chuck table configured to hold a workpiece; and
    a laser beam irradiating mechanism configured to perform laser processing on a workpiece held by the chuck table;
    the laser beam irradiating mechanism including
        a pulsed laser oscillator configured to oscillate a pulsed laser beam,
        a condenser configured to condense the laser beam oscillated from the pulsed laser oscillator, and irradiate the workpiece held on the chuck table with the condensed laser beam,
        a polygon mirror disposed between the pulsed laser oscillator and the condenser, and having a plurality of mirrors arranged concentrically with respect to a rotating shaft, the plurality of mirrors dispersing the pulsed laser beam oscillated from the pulsed laser oscillator, and
        guiding means disposed between the pulsed laser oscillator and the polygon mirror, the guiding means guiding the pulsed laser beam such that the pulsed laser beam is not applied to an angular portion of mirrors adjacent to each other.

2. The laser processing apparatus according to claim 1, wherein the guiding means includes an optical switching element configured to selectively guide the pulsed laser beam oscillated from the pulsed laser oscillator to a first path and a second path, a polarization beam splitter configured to guide the pulsed laser beams guided to the first path and the second path to a third path in which the polygon mirror is disposed, rotation position detecting means for detecting a rotation position of the polygon mirror, and control means for controlling the optical switching element on a basis of a detection signal from the rotation position detecting means such that the pulsed laser beams are not applied to an angular portion of adjacent mirrors of the polygon mirror, and the first path and the second path are positioned such that the polarization beam splitter branches the pulsed laser beam guided to the first path and the pulsed laser beam guided to the second path with a predetermined interval between the pulsed laser beam guided to the first path and the pulsed laser beam guided to the second path.

* * * * *